United States Patent
Wagner et al.

(10) Patent No.: US 6,855,953 B2
(45) Date of Patent: Feb. 15, 2005

(54) ELECTRONIC CIRCUIT ASSEMBLY HAVING HIGH CONTRAST FIDUCIAL

(75) Inventors: Stephen J. Wagner, Boonton, NJ (US); Barbara B. Myrvaagnes, New York, NY (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 0 days.

(21) Appl. No.: 10/327,154

(22) Filed: Dec. 20, 2002

(65) Prior Publication Data

US 2004/0119156 A1 Jun. 24, 2004

(51) Int. Cl.[7] .............................................. H01L 23/58
(52) U.S. Cl. ....................... 257/48; 257/797; 257/798; 257/678; 257/684; 257/730
(58) Field of Search ........................ 257/48, 678, 684, 257/730, 797, 798

(56) References Cited

U.S. PATENT DOCUMENTS

| 5,912,438 | A | * | 6/1999 | Kubin | 174/250 |
|---|---|---|---|---|---|
| 6,203,891 | B1 | * | 3/2001 | Noddin | 428/209 |
| 6,475,877 | B1 | * | 11/2002 | Saia et al. | 438/460 |
| 6,542,352 | B1 | * | 4/2003 | Devoe et al. | 361/321.2 |
| 6,728,113 | B1 | * | 4/2004 | Knight et al. | 361/760 |
| 2003/0052421 | A1 | * | 3/2003 | Frohlich et al. | 257/797 |
| 2003/0075790 | A1 | * | 4/2003 | Steinberg et al. | 257/686 |
| 2003/0161091 | A1 | * | 8/2003 | Devoe et al. | 361/321.2 |

FOREIGN PATENT DOCUMENTS

| JP | 04150002 A | * | 5/1992 | H01C/7/04 |

* cited by examiner

Primary Examiner—Nathan J. Flynn
Assistant Examiner—Remmon R. Fordé
(74) Attorney, Agent, or Firm—RatnerPrestia

(57) ABSTRACT

An electronic circuit assembly having a fiducial on a lower layer substrate. The fiducial is viewed through a through hole that is aligned with the fiducial and extends through an upper layer substrate that is adjacent the lower layer substrate. The fiducial and the through hole provide a high contrast between the fiducial and the surrounding substrate permitting viewing and recognition of substrate orientation by a computer vision system.

17 Claims, 3 Drawing Sheets

ELECTRONIC CIRCUIT ASSEMBLY HAVING HIGH CONTRAST FIDUCIAL

FIELD OF THE INVENTION

The present invention relates, in general, to integrated circuits and, in particular, to an electronic circuit assembly that has a fiducial that is used in the recognition of substrate orientation.

BACKGROUND OF THE INVENTION

Machine vision computer optical recognition systems have evolved to become a mainstream automation tool. Accurate placements of components are essential in the manufacture of many electronic systems. The significant challenge for machine vision in automated applications is maintaining the ability to locate reference patterns integrated into the hardware despite changes in material appearance. Normal process variations result in a number of unpredictable and undesirable conditions for optical recognition. Among these are: contrast reversal, intensity gradients, low contrast gradients, angular uncertainties, blur caused by changes in depth of field, physical scale changes, partial obliteration of the reference patterns, and patterns of similar ambiguity within the vision processing field of the view window.

Advanced electronic systems utilize Low Temperature Co-Fired Ceramic (LTCC) substrate technologies in their construction. These technologies make use of an active semiconductor chip mounted to a thermal and electrical conductive material, as well as a heat spreader directly attached to the chassis giving the entire assembly superior thermal and electrical characteristics.

The primary function of machine visioning systems is to distinguish features from the given generated image. The reflective properties of LTCC substrates make proper feature recognition a challenging obstacle. LTCC substrates are manufactured with variations in the shades and colors of the ceramics as well as pad metallurgy appearance. The comparative reflective properties of LTCC substrates and metal pads show many similarities in the degree of light reflection of the two, thus not offering much contrast for feature recognition.

Due to the physical characteristics of LTCC substrates and the manufacturing techniques used in making LTCC substrates, it becomes disadvantageous to utilize printed features on the substrate for machine vision patterns. Low cost gradients, registration challenges, and random shrinkage of the LTCC substrate all contribute to process variations. Also, if the corners of the rectangular through hole served as the vision system pattern reference, that image would change after installation of the heat spreader, thereby further confusing the vision system during the semiconductor place.

SUMMARY OF THE INVENTION

An electronic circuit assembly, constructed in accordance with the present invention, includes a lower layer substrate having a fiducial and an upper layer substrate adjacent the lower layer substrate and having circuit components thereon and a through hole extending through the upper layer substrate that is aligned with the fiducial on the lower layer substrate.

DETAILED DESCRIPTION OF THE INVENTION

Figure 1:
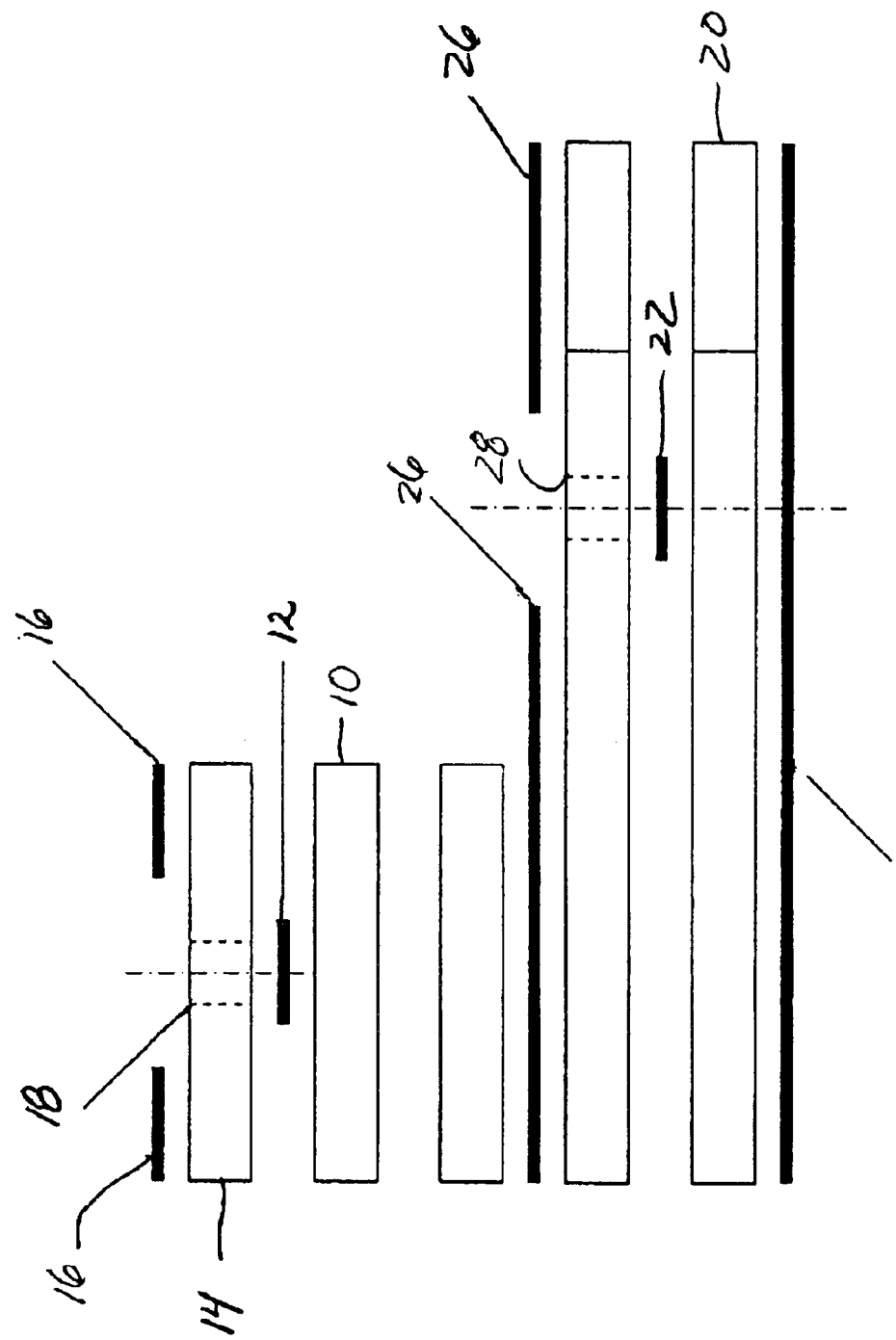
FIG. 1 an expanded cross-sectional schematic view if an electronic circuit assembly constructed in accordance with the present invention.
Figure 2:
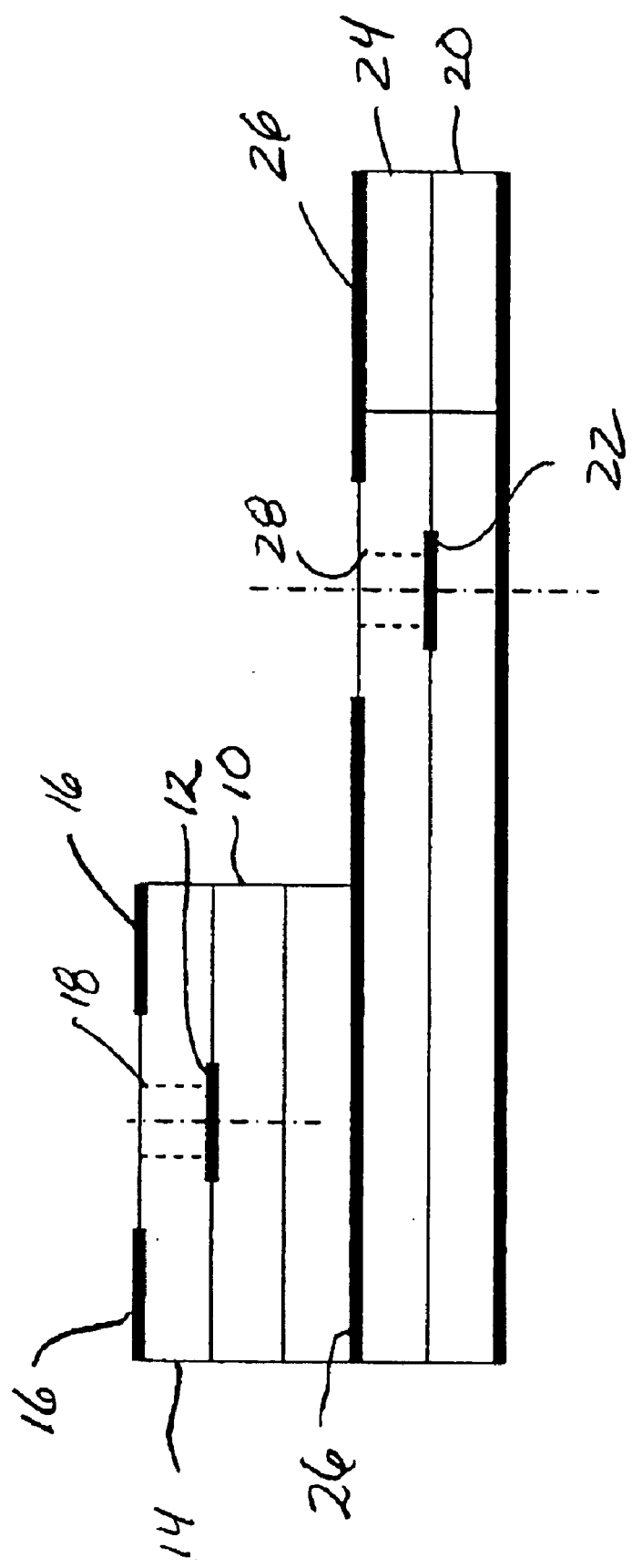
FIG. 2 cross-sectional schematic view if an electronic circuit assembly constructed in accordance with the present invention.

Referring to FIGS. 1 and 2, an electronic circuit assembly, constructed in accordance with the present invention, includes a lower layer substrate 10 having a fiducial 12. This electronic circuit assembly also has an upper layer substrate 14 adjacent lower layer substrate 10 and having circuit components 16 thereon and a through hole 18 that extends through the upper layer substrate and is aligned with fiducial 12 on the lower layer substrate. Lower layer substrate 10 and upper layer substrate 14 can be of ceramic material, such as a low temperature co-fired ceramic.

FIGS. 1 and 2 show that an electronic circuit assembly, constructed in accordance with the present invention, can have a plurality of pairs of lower layer substrates and upper layer substrates. This is indicated by a second lower layer substrate 20 having a fiducial 22 and a second upper layer substrate 24 adjacent lower layer substrate 20 and having circuit components 26 thereon and a through hole 28 that extends through upper layer substrate 24 and is aligned with fiducial 22 on lower layer substrate 20.

The sizes of fiducials 12 and 22 on lower layer substrates 10 and 20, respectively, are greater than the sizes of through holes 18 and 28 that extend, respectively, through upper layer substrates 14 and 24. The relative sizes of the fiducials and the through holes compensate for slight misalignments of the upper layer substrates and the lower layer substrates.

To provide a high contrasting image between the fiducials and material of the surrounding substrate layers above the fiducials, the fiducials are black. Ferro FX-87-011 resistor is a preferred fiducial material. Ferro FX-87-011 is a material sold by Ferro Electronics Materials and has the following composition by weight; 30 to 45% ruthenium dioxide; 30 to 45% boroaluminosilicate glass; 20 to 35% trimethylpentanediol monoisobutyrate; up to 15% terpinol; up to 5% silver; and up to 1% octylphenoxypolyethoxyethanol. The fiducial pigment can be deposited by silk screening.

Figure 3:
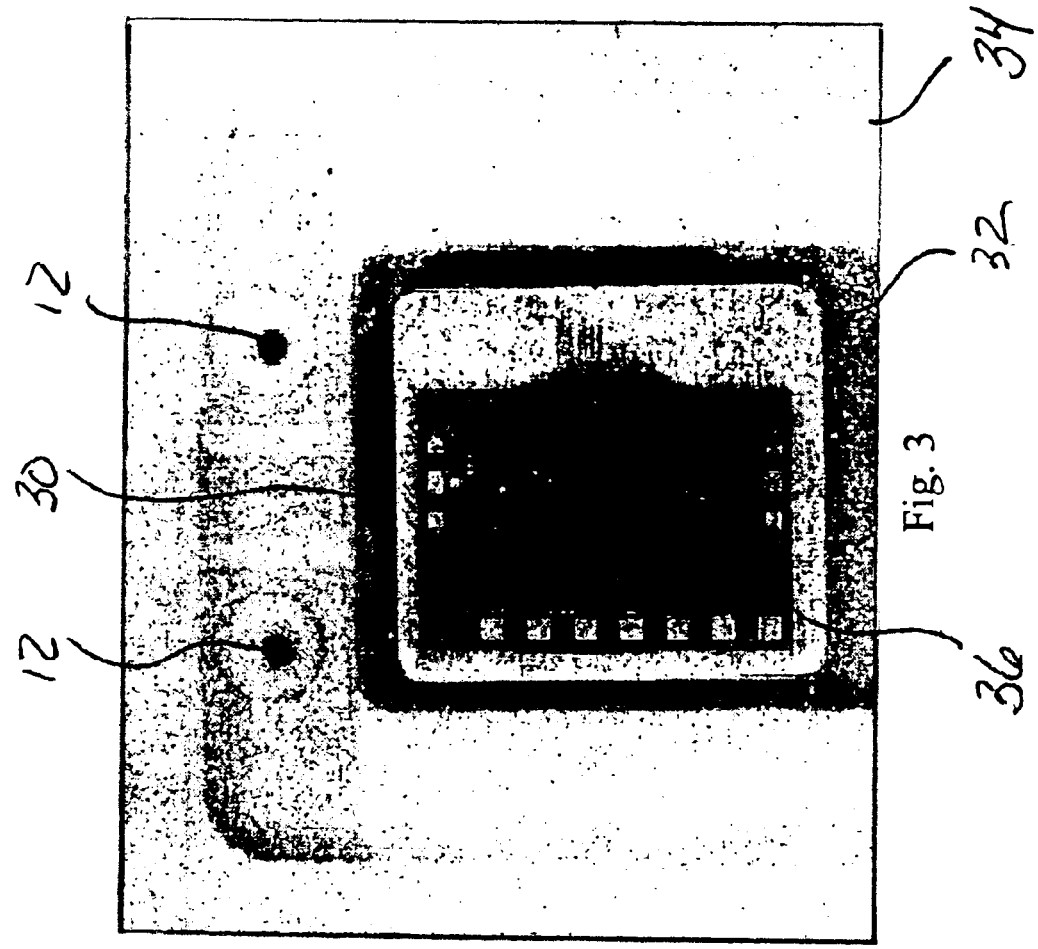
FIG. 3 a top view if an electronic circuit assembly constructed in accordance with the present invention.

FIG. 3 shows an application of the present invention. For the embodiment of the invention being described, fiducials 12 and through holes 18, extending through the upper layer substrate are outside of and spaced from the bounds of the circuitry composed of the components on the upper layer substrate. Fiducials 12 are on a substrate that is fastened to a chassis 30 that is seen through a gap between a heat sink 32 in a rectangular through hole and a substrate 34 that is fastened to the chassis. A chip 36 is mounted to heat sink 32.

The through holes in the upper layer substrates leave a shaped area through which the pigmented material fiducial can be viewed and recognized by a computer vision system that is disposed directly above the assembly. The high contrasting quality of the fiducial is not solely a function of the pigmented material. With the pigmented material located at the bottom of a hole, there is some degree of shadowing that enhances the contrast of the fiducial with the surrounding material.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. An electronic circuit assembly comprising:
   a lower layer ceramic substrate having a pigmented fiducial; and
   an upper layer ceramic substrate adjacent said lower layer substrate, a through hole extending through said upper layer substrate and aligned with said fiducial on said lower layer substrate, said pigmented fiducial having a high contrast relative to said upper layer ceramic substrate to provide a high contrasting image between said fiducial and said upper layer substrate, wherein the size of said fiducial on said lower layer substrate is greater than the size of said through hole extending through said upper layer substrate.

2. An electronic circuit assembly comprising:
   a lower layer ceramic substrate having a pigmented fiducial; and
   an upper layer ceramic substrate adjacent said lower layer substrate, a through hole extending through said upper layer substrate and aligned with said fiducial on said lower layer substrate, said pigmented fiducial having a high contrast relative to said upper layer ceramic substrate to provide a high contrasting image between said fiducial and said upper layer substrate, wherein said fiducial is black.

3. An electronic circuit assembly according to claim 2 wherein said fiducial is Ferro FX-87-011 resistor material.

4. An electronic circuit assembly comprising:
   a lower layer ceramic substrate having a pigmented fiducial; and
   an upper layer ceramic substrate adjacent said lower layer substrate, a through hole extending through said upper layer substrate and aligned with said fiducial on said lower layer substrate, said pigmented fiducial having a high contrast relative to said upper layer ceramic substrate to provide a high contrasting image between said fiducial and said upper layer substrate. wherein the lower ceramic substrate is carried on a chassis on which a chip is carried and wherein said through hole extending through said upper layer substrate and said fiducial on said lower layer substrate are outside of and spaced from the bounds of said chip.

5. An electronic circuit assembly according to claim 4 wherein the size of said fiducial on said lower layer substrate is greater than the size of said through hole extending through said upper layer substrate.

6. An electronic circuit assembly according to claim 4 wherein said fiducial is black.

7. An electronic circuit assembly according to claim 6 wherein said fiducial is Ferro FX-87-011 resistor material.

8. An electronic circuit assembly comprising:
   a lower layer substrate having a black fiducial made of FERRO FX-87-011 resistor material; and
   an upper layer substrate adjacent said lower layer substrate and having circuit components thereon and a through hole extending through said upper layer substrate and aligned with said fiducial on said lower layer substrate, the size of said fiducial on said lower layer substrate is greater than the size of said through hole extending through said upper layer substrate.

9. An electronic circuit assembly according to claim 8 wherein said lower layer substrate and said upper layer substrate are ceramic material.

10. An electronic circuit assembly according to claim 8 wherein said ceramic material is a low temperature co-fired ceramic.

11. An electronic circuit assembly comprising:
    a lower layer substrate having a black fiducial made of FERRO FX-87-011 resistor material; and
    an upper layer substrate adjacent said lower layer substrate and having circuit components thereon and a through hole extending through said upper layer substrate and aligned with said fiducial on said lower layer substrate, the size of said fiducial on said lower layer substrate being greater than the size of said through hole extending through said upper layer substrate, and said through hole extending through said upper layer substrate and said fiducial on said lower layer substrate are outside of and spaced from the bounds of the circuitry composed of said components on said upper layer substrate.

12. An electronic circuit assembly comprising:
    a chassis having a surface on which a chip is carried; and,
    a ceramic substrate carried on the chassis, said substrate being formed with an opening exposing said chip; said ceramic substrate having a pigmented fiducial providing a high contrast with said substrate such that said fiducial can be viewed from above the assembly.

13. An electronic circuit assembly according to claim 12 wherein said surface of said chassis carries a heat sink on which said chip is mounted.

14. An electronic circuit assembly according to claim 12 wherein said pigmented fiducial has a high contrast relative to said ceramic substrate.

15. An electronic circuit assembly according to claim 12 wherein said ceramic substrate comprises a low-temperature co-fired ceramic.

16. An electronic circuit assembly according to claim 12 wherein said pigmented fiducial comprises a resistor material.

17. An electronic circuit assembly according to claim 16 wherein said resistor material comprises FERRO FX-87-011.

* * * * *